(12) United States Patent
Yu et al.

(10) Patent No.: US 12,381,133 B2
(45) Date of Patent: Aug. 5, 2025

(54) POWER SEMICONDUCTOR DEVICE

(71) Applicant: Industrial Technology Research Institute, Hsinchu (TW)

(72) Inventors: Tai-Jyun Yu, Taoyuan (TW);
Sheng-Tsai Wu, Taoyuan (TW);
Kuo-Shu Kao, New Taipei (TW);
Han-Lin Wu, Hsinchu (TW);
Tai-Kuang Lee, Taoyuan (TW);
Jing-Yao Chang, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 217 days.

(21) Appl. No.: 17/667,558

(22) Filed: Feb. 9, 2022

(65) Prior Publication Data
US 2023/0197578 A1 Jun. 22, 2023

(30) Foreign Application Priority Data

Dec. 16, 2021 (TW) .................. 110147293

(51) Int. Cl.
*H01L 23/495* (2006.01)
*H01L 23/00* (2006.01)

(52) U.S. Cl.
CPC ........ *H01L 23/49548* (2013.01); *H01L 24/32* (2013.01); *H01L 24/83* (2013.01); *H01L 2224/32245* (2013.01); *H01L 2224/83815* (2013.01)

(58) Field of Classification Search
CPC ......... H01L 24/32; H01L 24/83; H01L 24/29; H01L 2224/32245; H01L 2224/83815; H01L 23/49548; H01L 23/48; H01L 24/01; H01L 24/26; H01L 24/27; H01L 24/28

See application file for complete search history.

(56) References Cited

U.S. PATENT DOCUMENTS

| | | | |
|---|---|---|---|
| 7,723,620 B2 | 5/2010 | Kawade et al. |
| 8,087,943 B2 | 1/2012 | Stolze |
| 8,502,385 B2 | 8/2013 | Oka et al. |
| 9,406,633 B2 | 8/2016 | Isozaki |
| 9,876,293 B2 | 1/2018 | Onishi et al. |
| 10,231,340 B2 | 3/2019 | Yao et al. |

(Continued)

FOREIGN PATENT DOCUMENTS

| | | |
|---|---|---|
| CN | 101546741 | 9/2009 |
| CN | 105027279 | 11/2015 |

(Continued)

OTHER PUBLICATIONS

"Office Action of Taiwan Counterpart Application", issued on Feb. 9, 2022, pp. 1-5.

(Continued)

*Primary Examiner* — Julio J Maldonado
*Assistant Examiner* — Stanetta D Isaac
(74) *Attorney, Agent, or Firm* — JCIPRNET

(57) ABSTRACT

A power semiconductor device, including a terminal base, is provided. The terminal base has a first end and a second end opposite to each other. The first end has a first flange expanding outward. The first flange is welded to a pad of a substrate by a solder. An included angle between an extension direction of the first flange and a length direction of the terminal base is greater than 90 degrees.

10 Claims, 8 Drawing Sheets

(56) References Cited

U.S. PATENT DOCUMENTS

| | | | |
|---|---|---|---|
| 10,398,036 B2 | 8/2019 | Kai et al. | |
| 2009/0194884 A1* | 8/2009 | Stolze | H05K 3/3426 |
| | | | 257/E23.024 |
| 2014/0104766 A1* | 4/2014 | Clayton | G06F 1/20 |
| | | | 361/728 |
| 2015/0340333 A1* | 11/2015 | Isozaki | H01L 24/13 |
| | | | 257/737 |
| 2016/0380366 A1* | 12/2016 | Onishi | H01L 29/7393 |
| | | | 257/698 |
| 2018/0279484 A1 | 9/2018 | Kai et al. | |

FOREIGN PATENT DOCUMENTS

| | | |
|---|---|---|
| CN | 106298717 | 1/2017 |
| CN | 113113371 | 7/2021 |
| CN | 113764915 | 12/2021 |
| JP | 2010283107 | 12/2010 |
| TW | 201513301 | 4/2015 |

OTHER PUBLICATIONS

"Office Action of Taiwan Counterpart Application", issued on Feb. 26, 2024, p. 1-p. 6.

\* cited by examiner

POWER SEMICONDUCTOR DEVICE

CROSS-REFERENCE TO RELATED APPLICATION

This application claims the priority benefit of Taiwan application serial no. 110147293, filed on Dec. 16, 2021. The entirety of the above-mentioned patent application is hereby incorporated by reference herein and made a part of this specification.

BACKGROUND

Technical Field

The disclosure relates to a power semiconductor device.

Description of Related Art

In recent years, the process technology of power semiconductor devices has developed rapidly, which has greatly improved the functions of electronic elements. The existing common power semiconductor devices are mainly connected to the outside through signal terminals on housings. The signal terminals on the housings are fixed through injection molding, and the signal terminals are then connected to internal circuits through wire-bonding. However, the signal terminals of such method are distributed on the periphery, the overall size is relatively large, and the electrical conduction path is long such that the parasitic impedance is relatively large.

In recent years, another technology has been developed to directly weld the signal terminal to an internal circuit board, which could greatly reduce the overall size and effectively reduce the number of wires. However, the welding strength of the signal terminal determines the reliability of a product.

SUMMARY

The power semiconductor device of the disclosure includes a terminal base. The terminal base has a first end and a second end opposite to each other. The first end has a first flange expanding outward. The first flange is welded to a pad of a substrate by a solder. An included angle between an extension direction of the first flange and a length direction of the terminal base is greater than 90 degrees.

DETAILED DESCRIPTION OF DISCLOSED EMBODIMENTS

Figure 1:
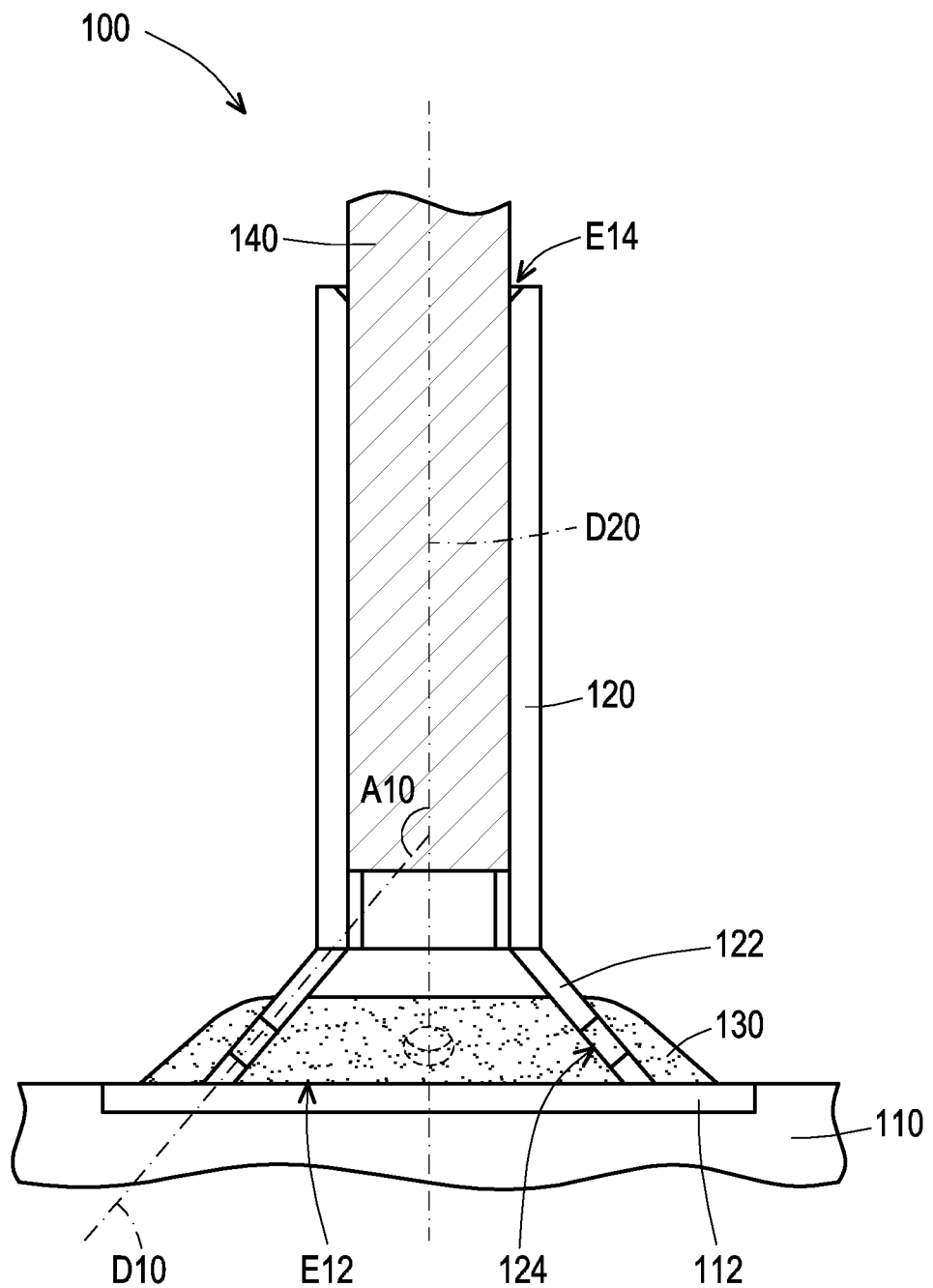
FIG. 1 is a partial cross-sectional schematic view of a power semiconductor device according to an embodiment of the disclosure.
Figure 2:
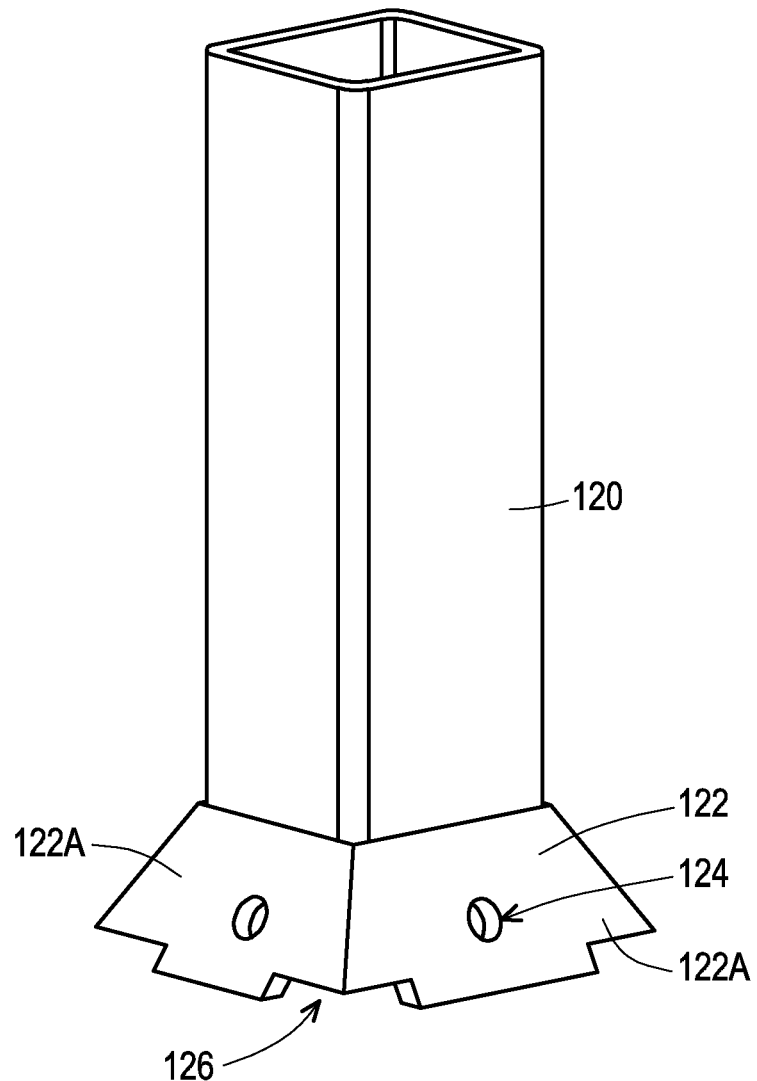
FIG. 2 is a perspective schematic view of a terminal base of the power semiconductor device of FIG. 1.

FIG. 1 is a partial cross-sectional schematic view of a power semiconductor device according to an embodiment of the disclosure. FIG. 2 is a perspective schematic view of a terminal base of the power semiconductor device of FIG. 1. Please refer to FIG. 1 and FIG. 2. A power semiconductor device 100 of the embodiment includes a terminal base 120. The terminal base 120 has a first end E12 and a second end E14 opposite to each other. The first end E12 has a first flange 122 expanding outward. From another point of view, a radial width of the first flange 122 gradually increases from a side close to the second end E14 to a side away from the second end E14. The first flange 122 is welded to a pad 112 of a substrate 110 by a solder 130. Therefore, the terminal base 120 and the pad 112 are electrically connected. An included angle A10 between an extension direction D10 of the first flange 122 and a length direction D20 of the terminal base 120 is greater than 90 degrees.

According to the above, since the first end E12 of the terminal base 120 has the first flange 122 expanding outward, when the first flange 122 is welded to the pad 112 by the solder 130, the solder 130 is easier to stay at a higher position on the first flange 122. In addition, a space for accommodating the solder 130 in the first flange 122 is also greater. On the whole, an amount of the solder 130 between the first flange 122 and the pad 112 is more than that of a conventional terminal base that does not have the first flange 122 expanding outward. Therefore, the welding strength could be enhanced, thereby improving the reliability of the entire power semiconductor device 100.

In the embodiment, the included angle A10 between the extension direction D10 of the first flange 122 and the length direction D20 of the terminal base 120 is less than or equal to 150 degrees, but the disclosure is not limited thereto.

In the embodiment, the power semiconductor device 100 further includes a terminal needle 140. The terminal base 120 of the embodiment has a hollow cylindrical shape, and the terminal needle 140 is inserted into the terminal base 120. In the embodiment, only one single terminal base 120 together with one terminal needle 140 are used as an example, but in other embodiments, the numbers of the terminal base 120 and the terminal needle 140 may be more, and the disclosure is not limited thereto. Since the height of the terminal base 120 is relatively low, when the power semiconductor device 100 needs a wire-bonding process to be connected to other pads (not shown), the interference to the wire-bonding process could be reduced. After the wire-bonding process is completed, the terminal needle 140 is inserted into the terminal base 120 to improve the convenience of external connection of the power semiconductor device 100 by the terminal base 120 and the terminal needle 140.

Figure 4:
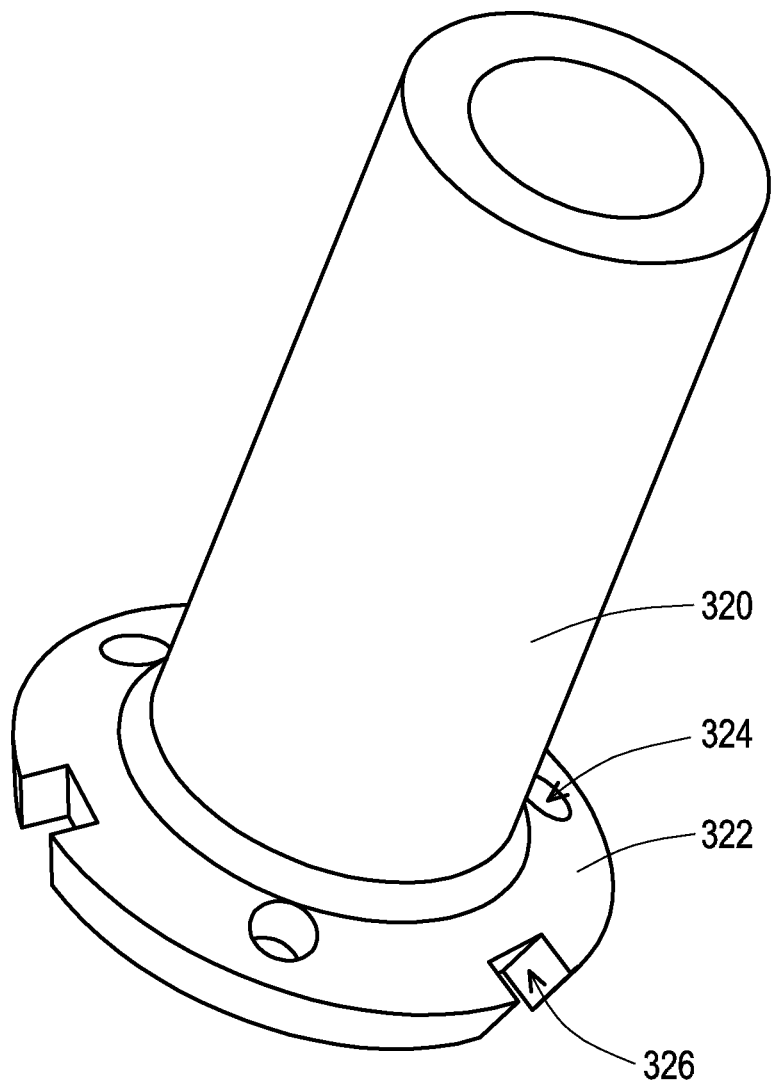
FIG. 4 is a perspective schematic view of a terminal base of a power semiconductor device according to yet another embodiment of the disclosure.

In the embodiment, the first flange 122 has at least one perforation 124, and a portion of the solder 130 is filled in the perforation 124. The perforation 124 is a hole penetrating the first flange 122, and the perforation 124 has a closed edge. That is, the perforation 124 is not located on an edge of the first flange 122 close to the pad 112. In the embodiment, the perforations 124 are symmetrically disposed (as shown in the embodiment of FIG. 2) or circularly equidistantly disposed (as shown in the embodiment of FIG. 4). Such setting helps to increase the uniformity of solder climbing, and avoids poor uniformity of solder climbing due to an asymmetrical setting, which causes stress to be concentrated on one side, resulting in the issue of low reliability. The first flange 122 of the embodiment has four perforations 124. In other embodiments, the perforations may be asymmetrically disposed, and the first flange may have one perforation, two perforations, or more perforations. Due to the presence of the perforation 124, the solder 130 could climb higher during welding to increase the amount of the solder 130 staying. In addition, since the solder 130 is filled in the perforation 124, the bonding strength between the solder 130 and the first flange 122 could also be improved.

In the embodiment, the edge of the first flange 122 has at least one exhaust notch 126. The exhaust notch 126 penetrates the first flange 122, and the exhaust notch 126 has an open edge. That is, the exhaust notch 126 is located on the edge of the first flange 122 close to the pad 112. The exhaust notch 126 of the embodiment is located at a turning point of the first flange 122, but the disclosure is not limited thereto. In order to improve the welding strength, the terminal base 120 and the pad 112 are usually reflow-welded. During a process of reflow-welding, the solder 130 may release gas. If the gas could not be quickly discharged out of the terminal base 120, the solder 130 may splash and stay on an inner wall of the terminal base 120, which may cause difficulty in subsequent insertion of the terminal needle 140. Since the edge of the first flange 122 of the embodiment has the exhaust notch 126, the issue could be improved.

In the embodiment, the first flange 122 includes four planes 122A connected to one another, but in other embodiments, less or more planes 122A may be connected to form the first flange 122.

Figure 3:
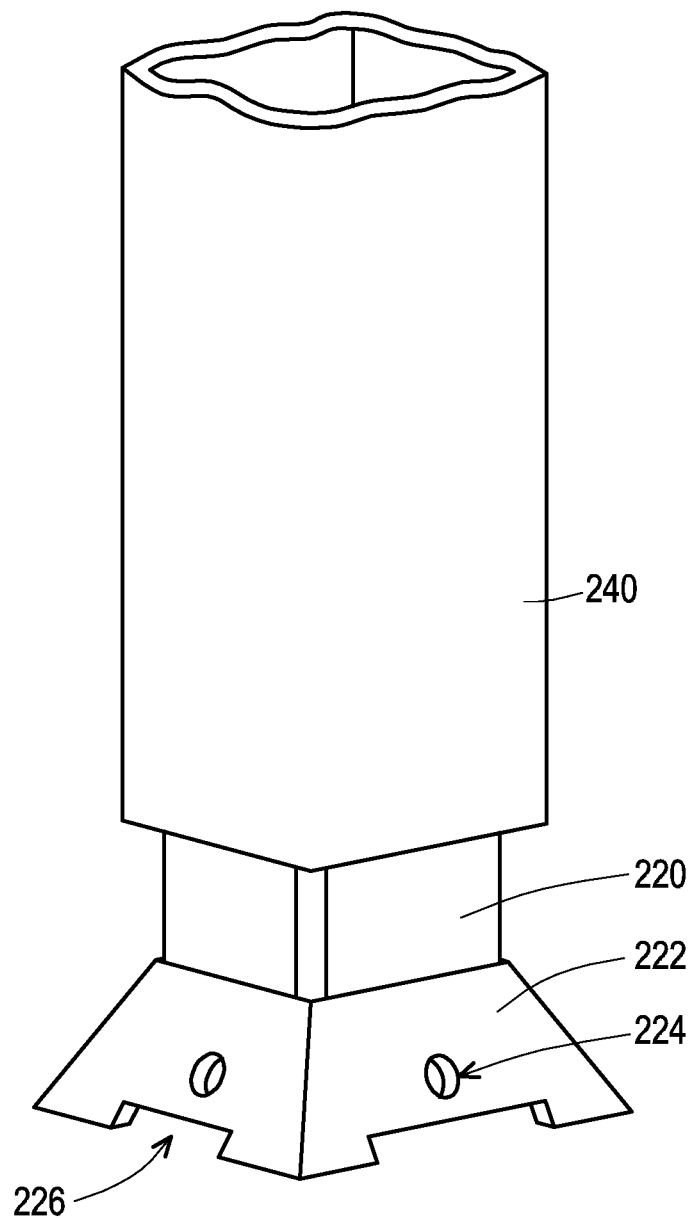
FIG. 3 is a perspective schematic view of bonding of a terminal base and a terminal needle of a power semiconductor device according to another embodiment of the disclosure.

FIG. 3 is a perspective schematic view of bonding of a terminal base and a terminal needle of a power semiconductor device according to another embodiment of the disclosure. Please refer to FIG. 3. In the embodiment, the power semiconductor device further includes a terminal needle 240. Different from the foregoing embodiment, the terminal needle 240 has a hollow cylindrical shape, and the terminal needle 240 is sleeved onto the terminal base 220. That is, the disclosure does not limit the bonding manner of the terminal needle and the terminal base, and other bonding manners may also be adopted. In addition, when the terminal needle 240 has a hollow cylindrical shape, a portion where the terminal base 220 and the terminal needle 240 are bonded may be solid. In addition, a first flange 222 of the terminal base 220 also has at least one perforation 224 and an exhaust notch 226, but the exhaust notch 226 is not located at a turning point of the first flange 222.

Figure 5:
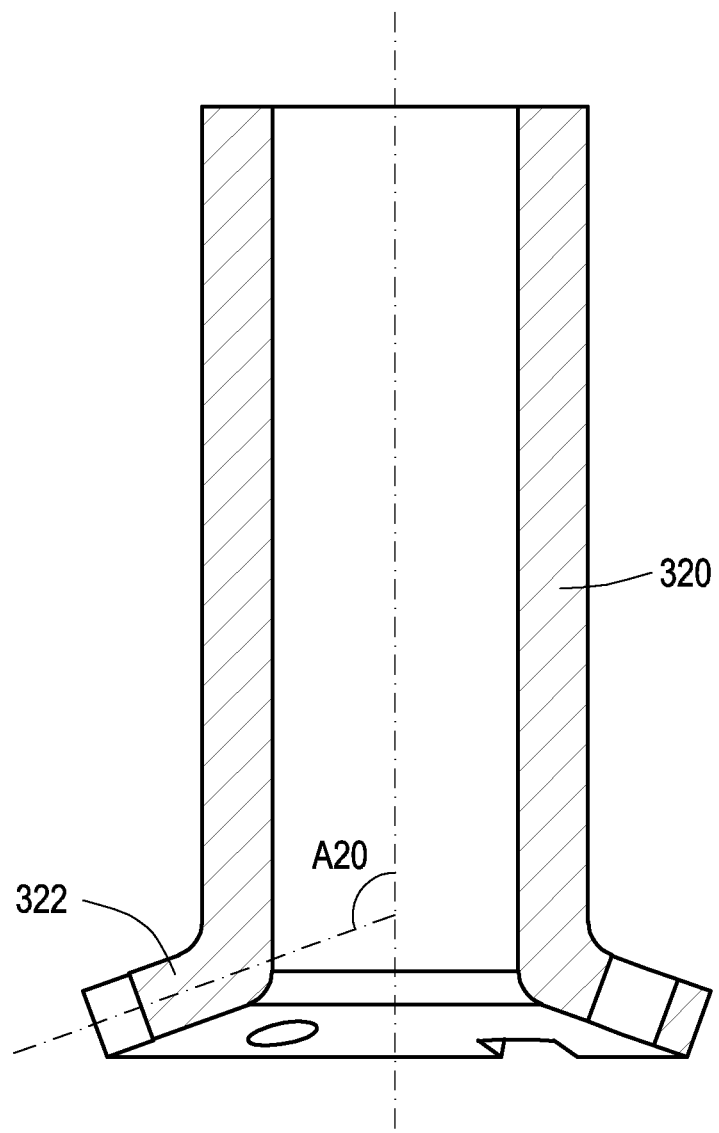
FIG. 5 is a perspective cross-sectional view of the terminal base of FIG. 4.

FIG. 4 is a perspective schematic view of a terminal base of a power semiconductor device according to yet another embodiment of the disclosure. FIG. 5 is a perspective cross-sectional view of the terminal base of FIG. 4. Please refer to FIG. 4 and FIG. 5. A terminal base 320 of the embodiment is similar to the terminal base 120 of FIG. 2 with the difference being that a first flange 322 of the embodiment has a curved surface. In addition, other portions of the terminal base 320 of the embodiment have cylindrical shapes, and a portion corresponding to the terminal base 120 of FIG. 2 has a square columnar shape, but the disclosure is not limited thereto. An included angle A20 between an extension direction of the first flange 322 and a length direction of the terminal base 320 is 110 degrees. The first flange 322 of the terminal base 320 also has at least one perforation 324 and an exhaust notch 326.

Figure 6:
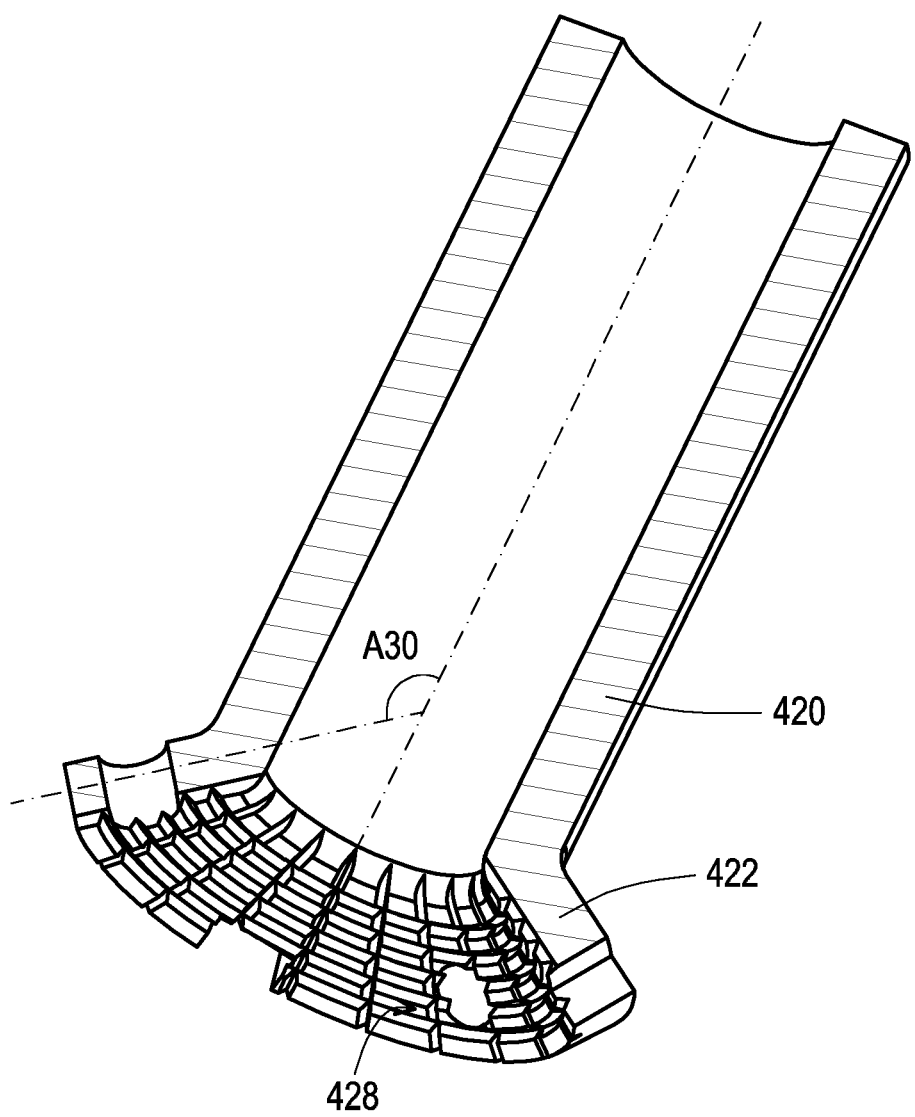
FIG. 6 is a perspective cross-sectional view of a terminal base of a power semiconductor device according to still another embodiment of the disclosure.

FIG. 6 is a perspective cross-sectional view of a terminal base of a power semiconductor device according to still another embodiment of the disclosure. Please refer to FIG. 6. A terminal base 420 of the embodiment is similar to the terminal base 320 of FIG. 5 with the difference being that a surface of a first flange 422 of the embodiment facing the pad 112 shown in FIG. 1 has an engraved pattern 428. That is, the surface of the first flange 422 has the engraved pattern 428 composed of many grooves. The engraved pattern 428 may be formed by cutting, stamping, or other manners, which is not limited in the disclosure. Since the first flange 422 has the engraved pattern 428, a contact area thereof with the solder 130 shown in FIG. 1 is greater, which could strengthen the bonding strength between the solder 130 and the first flange 422. In addition, an included angle A30 between an extension direction of the first flange 422 and a length direction of the terminal base 420 is 125 degrees.

Figure 7:
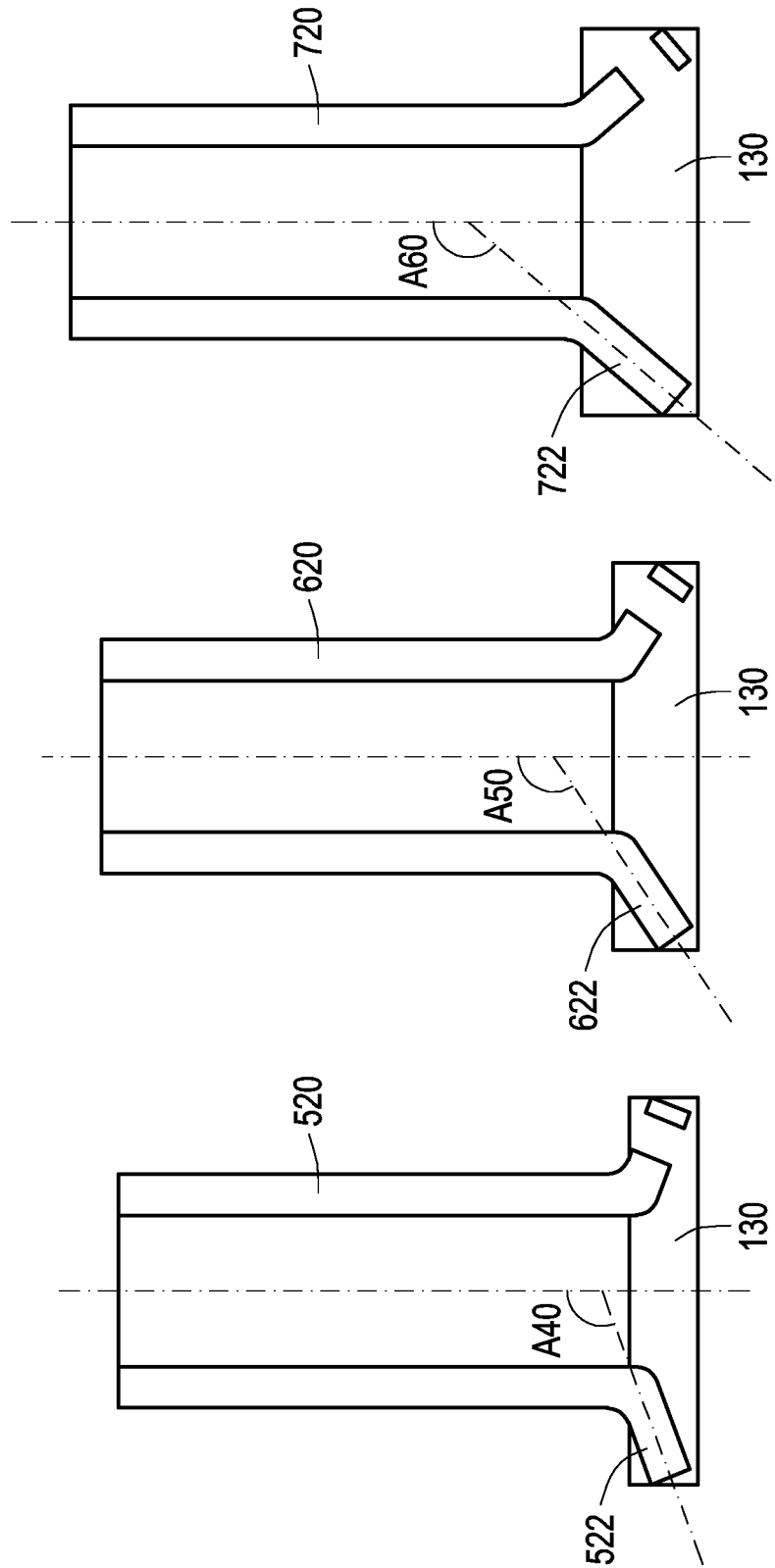
FIG. 7A, FIG. 7B, and FIG. 7C illustrate welding states of terminal bases having different flanges of the power semiconductor device according to the three embodiments of the disclosure.

FIG. 7A, FIG. 7B, and FIG. 7C illustrate welding states of terminal bases having different flanges of the power semiconductor device according to the three embodiments of the disclosure. Please refer to FIG. 7A, FIG. 7B, and FIG. 7C. An included angle A40 between an extension direction of a first flange 522 and a length direction of a terminal base 520 of FIG. 7A is 110 degrees, an included angle A50 between an extension direction of a first flange 622 and a length direction of a terminal base 620 of FIG. 7B is 125 degrees, and an included angle A60 between an extension direction of a first flange 722 and a length direction of a terminal base 720 of FIG. 7C is 140 degrees. It could be seen from the drawings that a height of the solder 130 to which the first flange 622 could be attached of FIG. 7B is higher than a height of the solder 130 to which the first flange 522 could be attached of FIG. 7A, and a height of the solder 130 to which the first flange 722 could be attached of FIG. 7C is higher than the height of the solder 130 to which the first flange 622 could be attached of FIG. 7B. Therefore, the terminal base 720 of FIG. 7C could theoretically provide the optimal welding strength.

Figure 8:
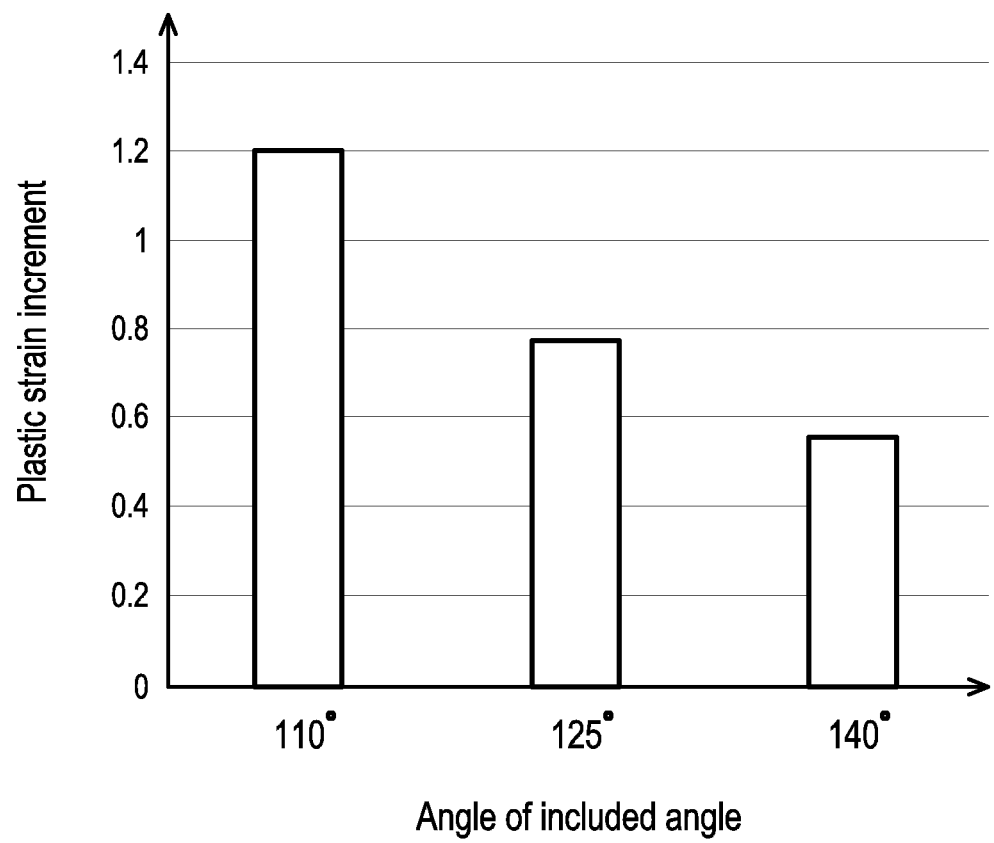
FIG. 8 illustrates welding strengths of the three terminal bases of FIG. 7A, FIG. 7B, and FIG. 7C.

FIG. 8 illustrates welding strengths of the three terminal bases of FIG. 7A, FIG. 7B, and FIG. 7C. Please refer to FIG. 8. The vertical axis in the drawing represents the plastic strain increment of the terminal base, which is the fatigue damage amount of the terminal base. The greater the fatigue damage amount, the more prone to issues with the bonding of the terminal base and the pad. In addition, the plastic strain increment in the drawing is not an actual value, but is normalized to highlight the difference between various data. It could be seen from FIG. 8 that the welding strength of the terminal base 620 of FIG. 7B is higher than the welding strength of the terminal base 520 of FIG. 7A, and the welding strength of the terminal base 720 of FIG. 7C is higher than the welding strength of the terminal base 620 of FIG. 7B.

In summary, in the power semiconductor device of an embodiment of the disclosure, the terminal base has the first flange expanding outward, so the amount of the solder between the first flange and the pad is greater, so the welding strength could be enhanced. When there is the perforation on the first flange, since the solder is filled in the perforation during welding, the bonding strength between the solder and the first flange could also be improved, thereby improving the reliability of the entire power semiconductor device.

What is claimed is:

1. A power semiconductor device, comprising:
a terminal base, having a first end and a second end opposite to each other, wherein the first end has a first flange expanding outward, the first flange is welded to a pad of a substrate by a solder, an included angle between an extension direction of a surface of the first flange and a length direction of the terminal base is greater than 90 degrees, the surface of the first flange faces and directly contacts the pad, and the included angle between the extension direction of the first flange and the length direction of the terminal base is less than or equal to 150 degrees.

2. The power semiconductor device according to claim 1, further comprising a terminal needle, wherein the terminal base has a hollow cylindrical shape, and the terminal needle is inserted into the terminal base.

3. The power semiconductor device according to claim 1, further comprising a terminal needle, wherein the terminal needle has a hollow cylindrical shape, and the terminal needle is sleeved onto the terminal base.

4. The power semiconductor device according to claim 1, wherein a surface of the first flange facing the pad has an engraved pattern.

5. The power semiconductor device according to claim 1, wherein an edge of the first flange has at least one exhaust notch.

6. The power semiconductor device according to claim 1, wherein the first flange comprises a plurality of planes connected to one another.

7. The power semiconductor device according to claim 1, wherein the first flange has a curved surface.

8. A power semiconductor device, comprising:
a terminal base, having a first end and a second end opposite to each other, wherein the first end has a first flange expanding outward, the first flange is welded to a pad of a substrate by a solder, an included angle between an extension direction of a surface of the first flange and a length direction of the terminal base is greater than 90 degrees, and the surface of the first flange faces and directly contacts the pad, wherein an edge of the first flange has at least one exhaust notch, the exhaust notch has an opening edge.

9. A power semiconductor device, comprising:
a terminal base, having a first end and a second end opposite to each other, wherein the first end has a first flange expanding outward, the first flange is welded to a pad of a substrate by a solder, an included angle between an extension direction of a surface of the first flange and a length direction of the terminal base is greater than 90 degrees, and the surface of the first flange faces and directly contacts the pad; and
a terminal needle, wherein the terminal needle has a hollow cylindrical shape, and the terminal needle is sleeved onto the terminal base.

10. A power semiconductor device, comprising:
a terminal base, having a first end and a second end opposite to each other, wherein the first end has a first flange expanding outward, the first flange is welded to a pad of a substrate by a solder, an included angle between an extension direction of a surface of the first flange and a length direction of the terminal base is greater than 90 degrees, the surface of the first flange faces and directly contacts the pad, and the first flange has at least one perforation, and a portion of the solder is filled in the at least one perforation; and
a terminal needle, wherein the terminal base has a hollow cylindrical shape, and the terminal needle is inserted into the terminal base.

* * * * *